United States Patent
Lee et al.

(10) Patent No.: US 7,106,131 B2
(45) Date of Patent: Sep. 12, 2006

(54) AMPLIFYING CIRCUIT

(75) Inventors: Chao-Cheng Lee, Hsin-Chu (TW); Chia-Jun Chang, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 53 days.

(21) Appl. No.: 10/707,803

(22) Filed: Jan. 13, 2004

(65) Prior Publication Data

US 2004/0201419 A1  Oct. 14, 2004

(30) Foreign Application Priority Data

Apr. 14, 2003  (TW) .............................. 92108552 A (51) Int. Cl.
*H03F 3/45* (2006.01)

(52) U.S. Cl. ............................ 330/69; 330/9

(58) Field of Classification Search ................ 330/9, 330/69, 254, 282, 284, 294; 341/143, 172
See application file for complete search history.

(56) References Cited

U.S. PATENT DOCUMENTS

| | | | |
|---|---|---|---|
| 4,034,308 A * | 7/1977 | Wermuth et al. ............. 330/86 |
| 4,158,786 A | 6/1979 | Hirasawa |
| 5,084,667 A | 1/1992 | Drori et al. |
| 5,119,097 A | 6/1992 | Ohkura et al. |
| 5,220,286 A * | 6/1993 | Nadeem ..................... 330/9 |
| 5,410,270 A * | 4/1995 | Rybicki et al. ............... 330/9 |
| 5,455,534 A | 10/1995 | Motegi et al. |
| 5,493,246 A * | 2/1996 | Anderson ................... 327/382 |
| 5,523,721 A | 6/1996 | Segawa et al. |
| 5,739,720 A | 4/1998 | Lee |
| 5,856,758 A * | 1/1999 | Joffe et al. ................... 330/85 |
| 5,867,057 A | 2/1999 | Hsu et al. |
| 5,949,279 A | 9/1999 | Kwan |
| 6,147,520 A | 11/2000 | Kothandaraman et al. |
| 6,249,240 B1 * | 6/2001 | Bellaouar ................... 341/172 |
| 6,313,687 B1 * | 11/2001 | Banu .......................... 327/317 |
| 6,369,645 B1 | 4/2002 | Takahashi |
| 6,429,723 B1 | 8/2002 | Hastings |
| 6,437,720 B1 * | 8/2002 | Yin et al. ................... 341/150 |
| 6,535,724 B1 * | 3/2003 | Pernici et al. .............. 455/296 |

(Continued)

FOREIGN PATENT DOCUMENTS

| | | |
|---|---|---|
| JP | 4-906 | 1/1992 |
| JP | 5-347520 | 12/1993 |

OTHER PUBLICATIONS

Allen, Phillip E., "Switched Capacitor Circuits." Sep. 7, 1984, pp. 72 to 87. Van Nostrand Roinhold Company Inc., New York, USA.

*Primary Examiner*—Linh V. Nguyen
(74) *Attorney, Agent, or Firm*—Winston Hsu (57) ABSTRACT

An amplifying circuit includes a differential amplifier having a positive input end, a negative input end, a positive output end, and a negative output end; a first input impedance coupled between the negative input end and a first input signal; a second input impedance coupled between the positive input end and the first input signal; a third input impedance coupled between the negative input end and a second input signal; a fourth input impedance coupled between the positive input end and the second input signal; a first output impedance coupled between the negative input end and the positive output end; a second output impedance coupled between the negative input end and the negative output end; a third output impedance coupled between the positive input end and the positive output end; and a fourth output impedance coupled between the positive input end and the negative output end.

21 Claims, 7 Drawing Sheets

U.S. PATENT DOCUMENTS

| | | |
|---|---|---|
| 6,549,075 B1 | 4/2003 | Zhang |
| 6,573,785 B1 * | 6/2003 | Callicotte et al. ............... 330/9 |
| 6,583,862 B1 | 6/2003 | Lim |
| 6,617,838 B1 * | 9/2003 | Miranda et al. ......... 324/117 R |
| 6,661,283 B1 * | 12/2003 | Lee ................................ 330/9 |
| 6,686,789 B1 | 2/2004 | Lopata et al. |
| 6,707,405 B1 * | 3/2004 | Kuttner ...................... 341/141 |
| 6,747,475 B1 | 6/2004 | Yuffe et al. |
| 6,833,759 B1 * | 12/2004 | Sobel ......................... 330/282 |
| 2003/0146786 A1 * | 8/2003 | Gulati et al. .................... 330/9 |

* cited by examiner

AMPLIFYING CIRCUIT

BACKGROUND OF INVENTION

1. Field of the Invention

The present invention relates to an amplifying circuit, and more specifically, to an amplifying circuit capable of having high equivalent input impedance, high voltage gain (or high voltage attenuation), or a large time constant.

2. Description of the Prior Art

In basic circuit structures, amplifying circuits play a very important role. An amplifying circuit can be classified for different uses such as signal amplifying or power amplifying according to its application, the most common of which is the signal amplifying circuit.

Figure 1:
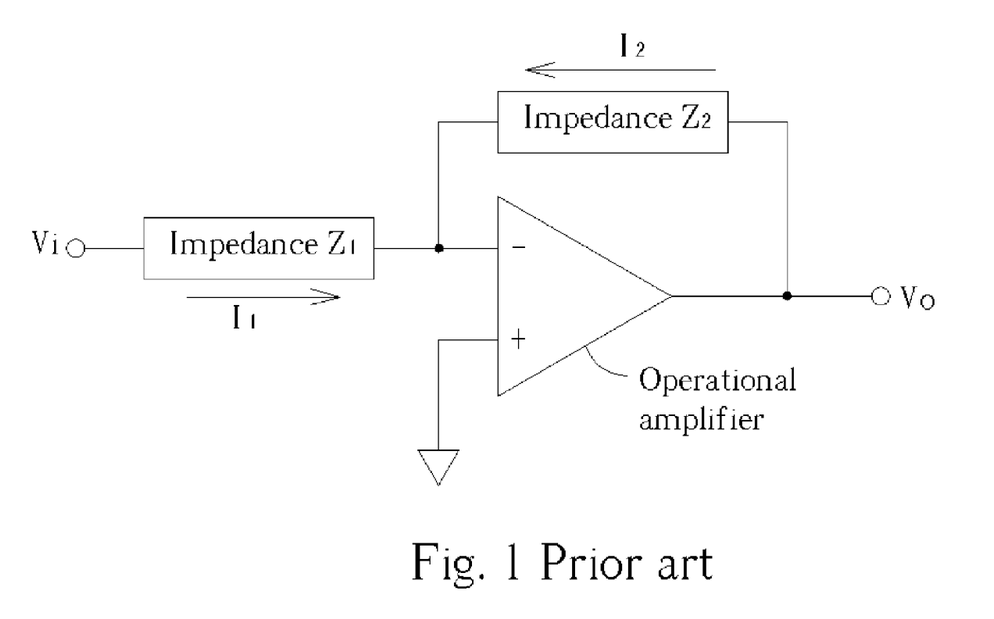
FIG. 1 illustrates an example of a signal amplifying circuit using an operational amplifier.

Please refer to FIG. 1 showing an example of a signal amplifying circuit using an operational amplifier. In the structure shown in FIG. 1, a formula as follows can be applied. Since the negative input end of the operational amplifier is virtually grounded, the voltage on the negative input end is 0V. Therefore, no current flows through the negative input end, and an equation $I_1+I_2=0$ can be found. As a result, the following formula can be found:

$$Vo/Vi=-Z_2/Z_1 \qquad \text{formula 1}$$

In general application, in order to obtain better signal quality and frequency response, an amplifying circuit having high equivalent input impedance, high voltage gain (or high voltage attenuation), or a large time constant is preferred. Thus different resistive impedances, capacitive impedances or inductive impedances are usually installed in the places of the impedance $Z_1$ and impedance $Z_2$ and arranged in different manners in order to achieve the above-mentioned objective.

However, passive elements such as resistors, capacitors and inductors used to achieve the preceding goal require very high values and therefore consume a very large circuit area when manufacturing, which causes a large cost in integrated circuit manufacturing.

SUMMARY OF INVENTION

It is therefore a primary objective of the present invention to provide an amplifying circuit.

According to an embodiment of the present invention an amplifying circuit comprises a differential amplifier having a positive input end, a negative input end, a positive output end, a negative output end; a first input impedance coupled between the negative input end and a first input signal; a second input impedance coupled between the positive input end and the first input signal; a third input impedance coupled between the negative input end and a second input signal and being substantially the same as the second input impedance; a fourth input impedance coupled between the positive input end and the second input signal and being substantially the same as the first input impedance; a first output impedance coupled between the negative input end and the positive output end; a second output impedance coupled between the negative input end and the negative output end; a third output impedance coupled between the positive input end and the positive output end and being substantially the same as the second output impedance; and a fourth output impedance coupled between the positive input end and the negative output end and being substantially the same as the first output impedance;wherein the positive output end is for outputting a first output signal and the negative output end is for outputting a second output signal.

Also according to another embodiment of the present invention, an amplifying circuit comprises an operational amplifier having a positive input end, a negative input end, an output end; a first input impedance coupled between the negative input end and a first input signal; a second input impedance coupled between the negative input end and a second input signal; and an output impedance coupled between the negative input end and the output end; wherein the output end is for outputting an output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
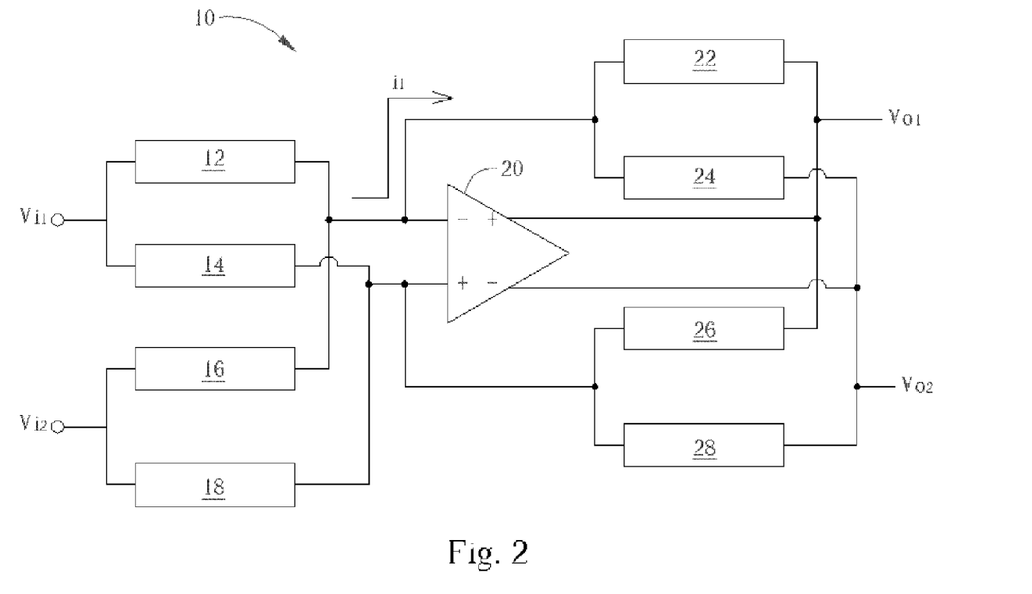
FIG. 2 illustrates an embodiment of an amplifying circuit according to the present invention.

Please refer to FIG. 2 showing one embodiment of an amplifying circuit 10 according to the present invention. The amplifying circuit 10 comprises a differential amplifier 20, which includes a positive input end, a negative input end (shown as +, − on the left of the differential amplifier 20 in FIG. 2), a positive output end, and a negative output end (shown as +, − on the right of the differential amplifier 20 in FIG. 2); a first input impedance 12 coupled between the negative input end and a first input signal $Vi_1$; a second impedance 14 coupled between the positive input end and the first input signal $Vi_1$; a third input impedance 16 coupled between the negative input end and a second input signal $Vi_2$ and is substantially the same as the second input impedance 14 meaning that the circuit characteristics and values of both are the same; a fourth impedance 18 coupled between the positive input end and the second input signal $Vi_2$ and is substantially the same as the first input impedance 12; a first output impedance 22 connected between the negative input end and the positive output end; a second output impedance 24 connected between the negative input end and the negative output end; a third output impedance 26 connected between the positive input end and the positive output end and is substantially the same as the second output impedance 24; and a fourth output impedance 28 connected between the positive input end and the negative output end and is substantially the same as the first output impedance 22. In this embodiment, the signal on the positive output end is taken as a first output signal $Vo_1$, and the signal on the negative output end is taken as a second output signal $Vo_2$.

Please note that in this embodiment, depending on the requirements on circuit design, these input impedances 12, 14, 16, 18, and these output impedance 22, 24, 26, 28 can be resistive impedances, capacitive impedances or inductive impedances.

The settings of the amplifying circuit 10 according to the present invention for high equivalent input impedance, high voltage gain (or high voltage attenuation), and a large time constant will be described respectively as follows. In the following description, since a typical amplifying circuit operates in a differential mode, the first input signal $Vi_1$ is taken as an input voltage of Vi, the second input signal $Vi_2$ is taken as an input voltage of $-Vi$, the first output signal $Vo_1$ is taken as Vo, and the second output signal $Vo_2$ is taken as Vo. Moreover, it is assumed that the positive input end and the negative input end of the differential amplifier 20 are virtually grounded (i.e. 0V), and the input impedance of the differential amplifier 20 is substantially infinite (i.e. no current flows between the input ends).

If a high equivalent input impedance is desired, the first input impedance 12 and the fourth input impedance 18 are set up to be resistive impedances with a value of Ri, and the second input impedance 14 and the third input impedance 16 are set up to be resistive impedances with a value of $Ri(1+\alpha)$, wherein $|\alpha|<<1$; that is, the value of the first input impedance 12 and that of the second input impedance 14 are very close, and the value of the third input impedance 16 and that of the fourth input impedance 18 are very close. Under these settings, an equation of current $i_1$ flowing through the negative input end of the differential amplifier 20 can be found as follows:

$$\frac{Vi_1 - 0}{Ri} + \frac{Vi_2 - 0}{Ri(1+\alpha)} = i_1$$

In this case, where the first input signal $Vi_1$ equals to Vi, the second input signal $Vi_2$ equals to Vi, and the current $i_1$ is an input current $i_i$, the above-mentioned equation can be derived to obtain the following result:

$$\frac{Vi}{i_i} = \frac{Ri(1+\alpha)}{\alpha} \cong \frac{Ri}{\alpha} \quad \because |\alpha| \ll 1 \quad \text{formula 2}$$

As shown by formula 2, the ratio between the input voltage Vi and the input current $i_i$ (i.e. equivalent input impedance) is approximately equal to $Ri/\alpha$. Since the absolute value of $\alpha$ is far less than 1, the equivalent input impedance in FIG. 2 can have a very large value in the structure of the amplifying circuit 10 according to the present invention. Please note that the same equation will be found on the current of the positive end of the differential amplifier 20, so a further description is hereby omitted.

If a high voltage gain is desired, the first input impedance 12 and the fourth input impedance 18 are set up to be resistive impedances with a value of Ri, the second input impedance 14 and the third input impedance 16 are set up to be substantially infinite, the first output impedance 22 and the fourth output impedance 28 are set up to be resistive impedances with a value of Rf, and the second output impedance 24 and the third output impedance 26 are set up to be resistive impedances with a value of $Rf(1+\beta)$, wherein $|\beta|<<1$; that is, the value of the first output impedance 22 and that of the second output impedance 24 are very close, and the value of the third output impedance 26 and that of the fourth output impedance 28 are very close. Under these settings, an equation of current $i_1$ flowing through the negative input end of the differential amplifier 20 can be found as follows:

$$\frac{Vi_1 - 0}{Ri} = -\left(\frac{Vo_1 - 0}{Rf} + \frac{Vo_2 - 0}{Rf(1+\beta)}\right)$$

Since the first input signal $Vi_1$ equals to Vi, the first output signal $Vo_1$ equals to Vo, and the second output signal $Vo_2$ equals to Vo, the above-mentioned equation can be derived to obtain the following result:

$$\frac{Vo}{Vi} = -\frac{Rf}{Ri} \times \frac{1}{\frac{\beta}{1+\beta}} \cong -\left(\frac{Rf}{Ri}\right)\left(\frac{1}{\beta}\right) \quad \because |\beta| \ll 1 \quad \text{formula 3}$$

As shown by formula 3, the ratio between the input voltage Vi and the output voltage Vo (i.e. the voltage gain) is approximately equal to $(Rf/Ri)/\beta$. Since the absolute value of $\beta$ is far less than 1, the voltage gain in FIG. 2 can have a very large value in the structure of the amplifying circuit 10 according to the present invention. Please note that the same equation will be found on the current of the positive end of the differential amplifier 20, so a further description is hereby omitted.

If a high voltage attenuation is desired, the first input impedance 12 and the fourth input impedance 18 are set up to be resistive impedances with a value of Ri, the second input impedance 14 and the third input impedance 16 are set up to be resistive impedances with a value of $Ri(1+\alpha)$, wherein $|\alpha|<<1$; that is, the value of the first input impedance 12 and that of the second input impedance 14 are very close, and the value of the third input impedance 16 and that of the fourth input impedance 18 are very close. The first output impedance 22 and the fourth output impedance 28 are set up to be resistive impedances with a value of Rf, and the second output impedance 24 and the third output impedance 26 are set up to be substantially infinite. Under these settings, an equation of current $i_1$ flowing through the negative input end of the differential amplifier 20 can be found as follows:

$$\frac{Vi_1 - 0}{Ri} + \frac{Vi_2 - 0}{Ri(1+\alpha)} = -\left(\frac{Vo_1 - 0}{Rf}\right)$$

Since the first input signal $Vi_1$ equals to Vi, the second input signal $Vi_2$ equals to Vi, and the first output signal $Vo_1$ equals to Vo, the above-mentioned equation can be derived to obtain the following result:

$$\frac{Vo}{Vi} = -\frac{Rf}{Ri} \times \frac{\alpha}{1+\alpha} \cong -\left(\frac{Rf}{Ri}\right)\alpha \quad \because |\alpha| \ll 1 \quad \text{formula 4}$$

As shown by formula 4, the ratio between the input voltage Vi and the output voltage Vo (i.e. the voltage gain) is approximately equal to $(Rf/Ri)/\beta$. Since the absolute value of $\beta$ is far less than 1, the voltage gain in FIG. 2 can have a very small value in the structure of the amplifying circuit 10 according to the present invention; that is, the voltage attenuation can have a very large value in FIG. 2. Please note that, the same equation will be found on the current of the positive end of the differential amplifier 20, so a further description is hereby omitted.

If a large time constant is desired, two applications are possible. The first application is that the first input impedance 12 and the fourth input impedance 18 are set up to be resistive impedances with a value of Ri, and the second input impedance 14 and the third input impedance 16 are set up to be resistive impedances with a value of $Ri(1+\alpha)$, wherein $|\alpha|<<1$; that is, the value of the first input impedance 12 and that of the second input impedance 14 are very close, and the value of the third input impedance 16 and that of the fourth input impedance 18 are very close. The first output impedance 22 and the fourth output impedance 28 are set up to be capacitive impedances with a value of 1/sC, and the second output impedance 24 and the third output impedance 26 are set up to be substantially infinite. Under these settings, an equation of current $i_1$ flowing through the negative input end of the differential amplifier 20 can be found as follows:

$$\frac{Vi_1 - 0}{Ri} + \frac{Vi_2 - 0}{Ri(1+\alpha)} = -\left(\frac{Vo_1 - 0}{\frac{1}{sC}}\right)$$

Since the first input signal $Vi_1$ equals to Vi, the second input signal $Vi_2$ equals to Vi, and the first output signal $Vo_1$ equals to Vo, the above-mentioned equation can be derived to obtain the following result:

$$\frac{Vo}{Vi} = -\frac{\frac{1}{sC}}{Ri} \times \frac{\alpha}{1+\alpha} \cong -\left(\frac{1}{s\left(\frac{RiC}{\alpha}\right)}\right) \quad \because |\alpha| \ll 1 \quad \text{formula 5}$$

As shown by formula 5, the time constant ratio is approximately equal to $RiC/\alpha$. Since the absolute value of $\alpha$ is far less than 1, the time constant in FIG. 2 can have a very large value in the structure of the amplifying circuit 10 according to the present invention. Please note that the same equation will be found on the current of the positive end of the differential amplifier 20, so a further description is hereby omitted.

The second application is that the first input impedance 12 and the fourth input impedance 18 are set up to be capacitive impedances with a value of 1/sC, the second input impedance 14 and the third input impedance 16 are set up to be substantially infinite, the first output impedance 22 and the fourth output impedance 28 are set up to be resistive impedances with a value of Rf, and the second output impedance 24 and the third output impedance 26 are set up to be resistive impedances with a value of Rf(1+β), wherein |β|<<1; that is, the value of the first output impedance 22 and that of the second output impedance 24 are very close, and the value of the third output impedance 26 and that of the fourth output impedance 28 are very close. Under these settings, an equation of current $i_1$ flowing through the negative input end of the differential amplifier 20 can be found as follows:

$$\frac{Vi_1 - 0}{\frac{1}{sC}} = -\left(\frac{Vo_1 - 0}{Rf} + \frac{Vo_2 - 0}{Rf(1+\beta)}\right)$$

Since the first input signal $Vi_1$ equals to Vi, the first output signal $Vo_1$ equals to Vo, and the second output signal $Vo_2$ equals to Vo, the above-mentioned equation can be derived to obtain the following result:

$$\frac{Vo}{Vi} = -\frac{Rf}{\frac{1}{sC}} \times \frac{\beta}{1+\beta} \cong -s\left(\frac{RfC}{\beta}\right) \quad \because |\beta| \ll 1 \quad \text{formula 6}$$

As shown by formula 6, the time constant ratio is approximately equal to $RiC/\beta$. Since the absolute value of $\beta$ is far less than 1, the time constant in FIG. 2 can be a very large value in the structure of the amplifying circuit 10 according to the present invention. Please note that the same equation will be found on the current of the positive end of the differential amplifier 20, so a further description is hereby omitted.

In order to manufacture two resistive impedances of very close values in an IC such as the above-mentioned Ri and Ri(1+α) or Rf and Rf(1+β) so that the value of α and β can satisfy the requirements, the present invention discloses two applications using a switched capacitor circuit to implement the first input impedance 12, the second input impedance 14, the third input impedance 16, the fourth input impedance 18, the first output impedance 22, the second output impedance 24, the third output impedance 26, or the fourth output impedance 28 as follows.

Figure 3:
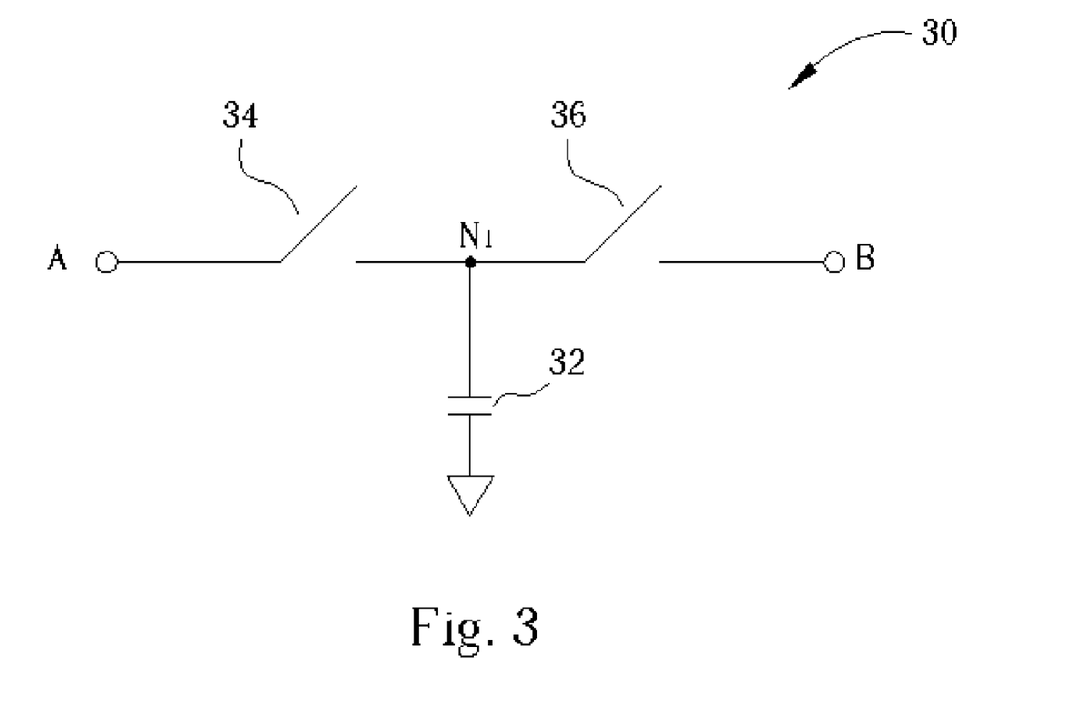
FIG. 3 illustrates a first switched capacitor circuit.

Please refer to FIG. 3 showing a first switched capacitor circuit 30 according to the first application. The switched capacitor circuit 30 comprises a capacitor 32 coupled between a first node $N_1$ and a ground end for storing electrical charges, a first switch 34 with one of its ends coupled to the first node N1 and the other end taken as an end A of the switched capacitor circuit 30, and a second switch 36 with one of its ends coupled to the first node $N_1$ and the other end taken as another end B of the switched capacitor circuit 30. Please note that, in actual operation, the first switch 34 and the second switch 36 are turned on alternately, and the duration of being turned on is the same.

Figure 4:
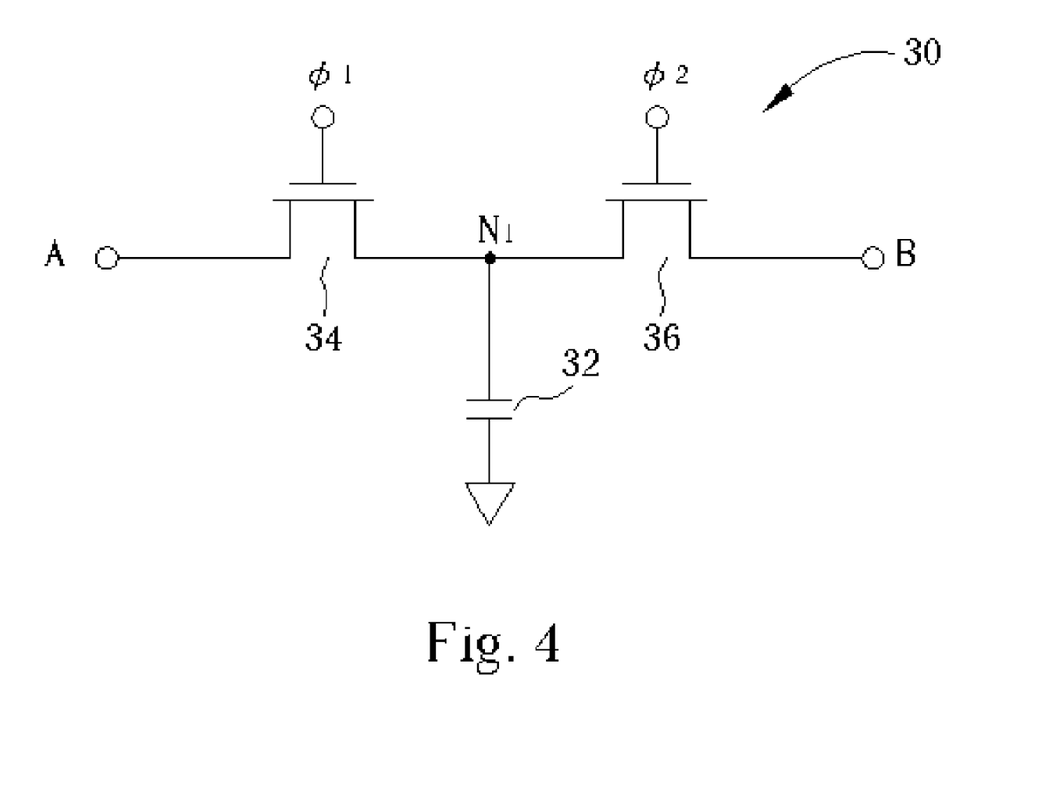
FIG. 4 illustrates an embodiment of a circuit diagram of the switched capacitor circuit in FIG. 3.

Please refer to FIG. 4 showing an embodiment of a circuit diagram of the switched capacitor circuit 30 in FIG. 3. As shown in FIG. 4, the first switch 34 and the second switch 36 are the same in type (e.g. both are NMOS transistors in FIG. 4). The first switch 34 is controlled by a first periodical signal $\psi_1$, and the second switch 36 is controlled by a second periodical signal $\psi_2$. The active state of the first periodical signal $\psi_1$ and that of the second periodical signal $\psi_2$ are alternate, and the duty cycle of the first periodical signal $\psi_1$ and of the second periodical signal $\psi_2$ are the same. In FIG. 4, since the first switch 34 and the second switch 36 are NMOS transistors, the first periodical signal $\psi_1$ and the second periodical signal $\psi_2$ are in active state when high; that is, when the periodical signal is in high voltage level, the switch being controlled is turned on.

A description to the operation of the switched capacitor circuit 30 in FIG. 4 is as follows. Assume that the end A of the switched capacitor circuit 30 is coupled to an equivalent voltage source. First the first periodical signal $\psi_1$ is set up to be in high voltage level, and the second periodical signal $\psi_2$ is set up to be in low voltage level so that the first switch 34 is turned on while the second switch 36 is turned off, and a charge path is formed from the end A via the first switch 34 and the capacitor 32 to the ground end. The equivalent voltage source charges the capacitor 32 during the time the first periodical signal $\psi_1$ is in high voltage level (i.e. active) so that the capacitor 32 stores electrical charges. Then the second periodical signal $\psi_2$ is set up to be in high voltage level, and the first periodical signal $\psi_1$ is set up to be in low voltage level so that the first switch 34 is turned off while the second switch 36 is turned on, and a discharge path is formed from the ground end via the capacitor 32 and the second switch 36 to the end B. The electrical charges stored in the capacitor 32 are discharged via the ground end, and a corresponding current is generated on the end B. If the frequencies of the first periodical signal $\psi_1$ and the second periodical signal $\psi_2$ are far larger than the operating frequency of the IC of the amplifying circuit 10, the switched capacitor circuit 30 can be regarded as equivalent to a resistive impedance because the end A is driven by the equivalent voltage source, and a current is consequentially generated on the end B.

In FIG. 4 if taking the capacitance of the capacitor 32 as $C_1$, the period of the first periodical signal $\psi_1$ and the second periodical signal $\psi_2$ as T, then the impedance between the end A and the end B of the switched capacitor circuit 30 is equal to $T/C_1$. Therefore, to generate two impedances of very close values such as the above-mentioned Ri and Ri(1+α) or Rf and Rf(1+β), only a proper control on the period of the first periodical signal $\psi_1$ and the second periodical signal $\psi_2$ of the switched capacitor circuit 30 in FIG. 4 is required.

Figure 5:
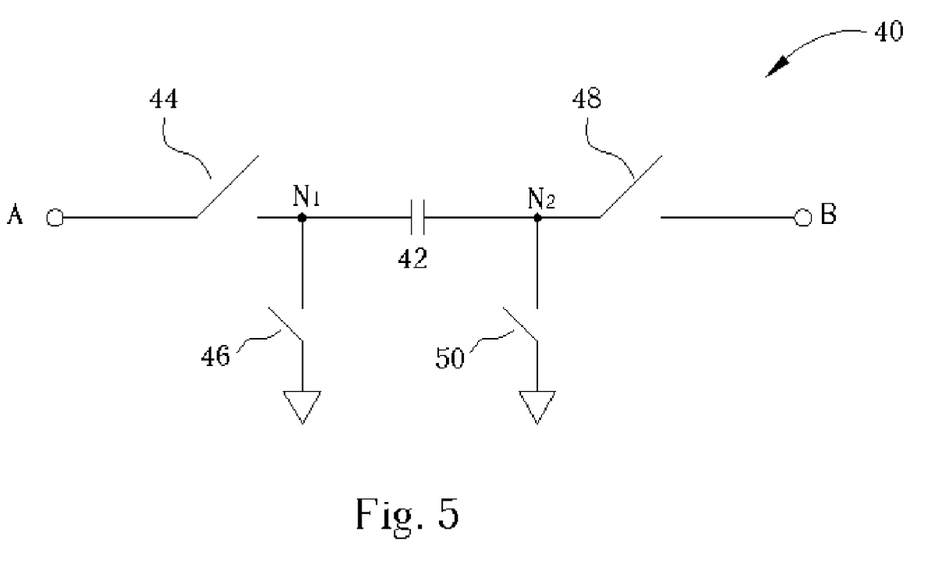
FIG. 5 illustrates a second switched capacitor circuit.

Please refer to FIG. 5 showing a second switched capacitor circuit 40 according to the second application. The switched capacitor circuit 40 comprises a capacitor 42 coupled between a first node $N_1$ and a second node $N_2$ for storing electrical charges, a first switch 44 with one of its ends coupled to the first node $N_1$ and the other end taken as an end A of the switched capacitor circuit 40, a second switch 46 connected between the first node $N_1$ and a ground end, a third switch 48 with one of its ends coupled to the second node $N_2$ and the other end taken as another end B of the switched capacitor circuit 30, and a fourth switch 50 connected between the second node $N_2$ and the ground end. Please note that, in actual operation, the first switch 44 accompanied by the fourth switch 50 and the second switch 46 accompanied by the third switch 48 are turned on alternately, and the duration of being turned on is the same.

Figure 6:
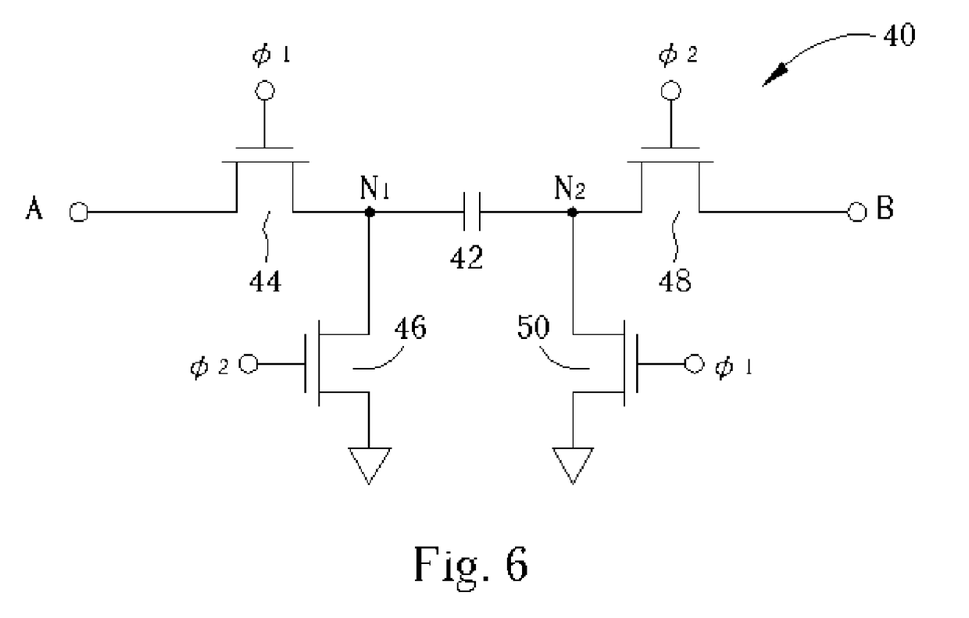
FIG. 6 illustrates an embodiment of a circuit diagram of the switched capacitor circuit in FIG. 5.

Please refer to FIG. 6 showing an embodiment of a circuit diagram of the switched capacitor circuit 40 in FIG. 5. As shown in FIG. 6, the first switch 44, the second switch 46, the third switch 48 and the fourth switch 50 are of the same in type (e.g. all are NMOS transistors in FIG. 6). The first switch 44 and the fourth switch 50 are controlled by a first periodical signal $\psi_1$, and the second switch 46 and the third switch 48 are controlled by a second periodical signal $\psi_2$. The active state of the first periodical signal $\psi_1$ and that of the second periodical signal $\psi_2$ are alternate, and the duty cycle of the first periodical signal $\psi_1$ and of the second periodical signal $\psi_2$ are the same. In FIG. 6, since the first switch 44, the second switch 46, the third switch 48 and the fourth switch 50 are NMOS transistors, the first periodical signal $\psi_1$ and the second periodical signal $\psi_2$ are in active state when high; that is, when the periodical signal is in high voltage level, the switch being controlled is turned on.

A description to the operation of the switched capacitor circuit 40 in FIG. 6 is as follows. Assume that the end A of the switched capacitor circuit 40 is coupled to an equivalent voltage source. First the first periodical signal $\psi_1$ is set up to be in high voltage level, and the second periodical signal $\psi_2$ is set up to be in low voltage level, so that the first switch 44 and the fourth switch 50 are turned on while the second switch 46 and the third switch 48 are turned off, and a charge path is formed from the end A via the first switch 44, the capacitor 42, and the fourth switch 50 to the ground end. The equivalent voltage source charges the capacitor 42 during the time the first periodical signal $\psi_1$ is in high voltage level (i.e. active) so that the capacitor 42 stores electrical charges. Then the second periodical signal $\psi_2$ is set up to be in high voltage level, and the first periodical signal $\psi_1$ is set up to be in low voltage level so that the first switch 44 and the fourth switch 50 are turned off while the second switch 46 and the third switch 48 are turned on, and a discharge path is formed from the ground end via the second switch 46, the capacitor 42 and the third switch 48 to the end B. The electrical charges stored in the capacitor 42 are discharged via the ground end, and a corresponding current is generated on the end B. If the frequencies of the first periodical signal $\psi_1$ and the second periodical signal $\psi_2$ are far larger than the operating frequency of the IC of the amplifying circuit 10, the switched capacitor circuit 40 can be regarded as equivalent to a resistive impedance, because the end A is driven by the equivalent voltage source and the current is consequentially generated on the end B.

In FIG. 6 if taking the capacitance of the capacitor 42 as $C_2$, the period of the first periodical signal $\psi_1$ and the second periodical signal $\psi_2$ as T, then the impedance between the end A and the end B of the switched capacitor circuit 40 is equal to $T/C_2$. Therefore, to generate two impedances of very close values such as the above-mentioned Ri and Ri(1+α) or Rf and Rf(1+β), only a proper control on the period of the first periodical signal $\psi_1$ and the second periodical signal $\psi_2$ of the switched capacitor circuit 40 in FIG. 6 is required.

Figure 7:
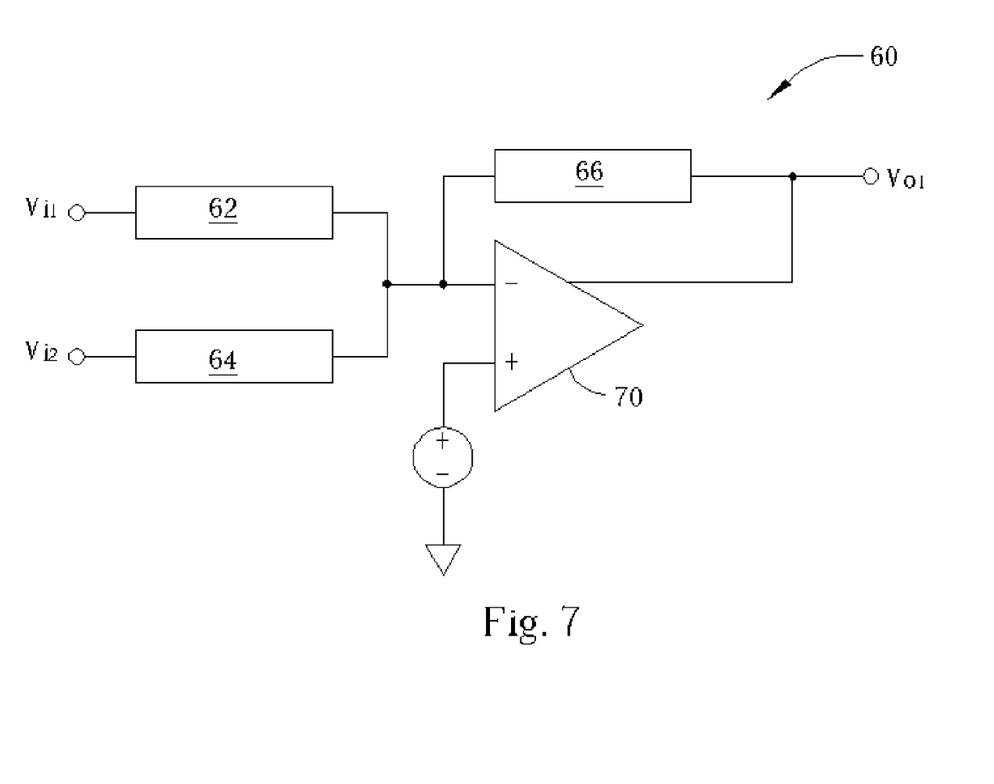
FIG. 7 illustrates another embodiment of an amplifying circuit according to the present invention.

In addition to the configuration in differential mode as shown in FIG. 2, the amplifying circuit according to the present invention can be also configured as in single-ended mode. Please refer to FIG. 7 showing an amplifying circuit 60 according to a second embodiment of the present invention. The amplifying circuit 60 comprises an operational amplifier 70, which includes a positive input end, a negative input end (shown as +, – on the left of the operational amplifier 70 in FIG. 7), and an output end; a first input impedance 62 coupled between the negative input end and a first input signal $Vi_1$; a second impedance 64 coupled between the negative input end and the second input signal $Vi_2$; and a first output impedance 66 connected between the negative input end and the output end. In this embodiment, the positive input end is connected to a DC voltage source (generally of 0V) for providing bias voltage, the signal on the positive output end is taken as a first output signal $Vo_1$, and the signal on the negative output end is taken as a second output signal $Vo_2$. Please note that, the operational amplifier 70 in FIG. 7 uses a differential amplifier with its positive output end (shown as + on the right of the operational amplifier 70 in FIG. 7) taken as the output end of the operational amplifier 70.

Please note that in this embodiment, depending on the requirements on circuit design, the first input impedance 62, the second input impedance 64, or the first output impedance 66 can be resistive impedances, capacitive impedances or inductive impedances.

Similarly to the amplifying circuit 10 in FIG. 2, through proper settings of the types and values of the first input impedance 62, the second input impedance 64 and the first output impedance 66 accompanied by formula 2, formula 4 and formula 5 mentioned above, the amplifying circuit 60 in FIG. 7 is able to have high equivalent input impedance, high voltage gain (or high voltage attenuation), and large time constant. The formulas are similar to that of the amplifying circuit 10 in FIG. 2; thus, a further description is hereby omitted. However please note that the first input impedance 12, the second input impedance 14 and the first output impedance 22 are replaced by the first input impedance 62, the second input impedance 64 and the first output impedance 66 in this embodiment.

Similarly, in order to manufacture two resistive impedances with very close values such as the above-mentioned Ri and Ri(1+α) or Rf and Rf(1+β), so that the value of α and β can satisfy requirements, in this embodiment the present invention can also be realized with two applications using a switched capacitor circuit to implement the first input impedance 62, the second input impedance 64, or the first output impedance 66 as the switched capacitor circuit 30 in FIG. 3 and FIG. 4, and the switched capacitor circuit 40 in FIG. 5 and FIG. 6 mentioned above. The switched capacitor circuit 30 and the switched capacitor circuit 40 applied in the amplifying circuit 60 are substantially the same to those of the earlier embodiment mentioned above, thus a further description is hereby omitted.

Please also note that for the input impedance or output impedance which is set to be substantially infinite in the various embodiments of the present invention mentioned above, one of ordinary skills in the art will be able to appreciate that such an impedance may be implemented, as one of many different applications, by actually removing the device providing the impedance from the designated location, i.e., by creating an opened-circuit connection at the designated location.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A circuit comprising:
an operational amplifier comprising a positive input end, a negative input end, and an output end;
a first input impedance coupled between the negative input end and a first input signal;
a second input impedance coupled between the negative input end and a second input signal; and
a first output impedance coupled between the negative input end and the output end;
wherein resistances of the first and second input impedances are controlled by a first and a second control signals respectively, so that the resistances of the first and second input impedances are substantially different from each other and are close to each other.

2. The circuit of claim 1 wherein the first input impedance is a switched capacitor circuit, the switched capacitor circuit comprises;
a capacitor coupled between a first node and a second node;
a first switch with one end coupled to the first node and another end used as an end of the switched capacitor circuit;
a second switch coupled between the first node and a common node;
a third switch with one end coupled to the second node and another end used as another end of the switched capacitor circuit; and
a fourth switch coupled between the second node and the common node.

3. The circuit of claim 1 wherein the circuit has a high input impedance characteristic.

4. The circuit of claim 1 wherein the first output impedance is a resistive-impedance, the circuit has a high voltage attenuation characteristic.

5. The circuit of claim 1 wherein the first output impedance is a capacitive-impedance, the circuit has a large time constant characteristic.

6. The circuit of claim 1 wherein the first input impedance is a switched capacitor circuit, the switched capacitor circuit comprises:
a capacitor coupled between a first node and a common node;
a first switch with one end coupled to the first node and another end used as an end of the switched capacitor circuit; and
a second switch with one end coupled to the first node and another end used as another end of the switched capacitor circuit,
wherein the first switch and the second switch are turned on alternately by the first control signal.

7. A circuit comprising:
a differential amplifier comprising a positive input end, a negative input end, a positive output end, and a negative output end;
a first input impedance coupled between the negative input end and a first input signal;
a second input impedance coupled between the positive input end and the first input signal;
a third input impedance coupled between the negative input end and a second input signal, the third input impedance being substantially equivalent to the second input impedance; and
a fourth input impedance coupled between the positive input end and the second input signal, the fourth input impedance being substantially equivalent to the first input impedance;
wherein resistances of the first and second input impedances are controlled by a first and a second control signals respectively.

8. The circuit of claim 7 wherein resistances of the first and second input impedances are close to each other.

9. The circuit of claim 8 wherein the circuit has a high input impedance characteristic.

10. The circuit of claim 7 further comprising:
a first output impedance coupled between the negative input end and the positive output end; and
a second output impedance coupled between the positive input end and the negative output end.

11. The circuit of claim 10 wherein the first and the second output impedances are a resistive-impedance, the circuit has a high voltage attenuation characteristic.

12. The circuit of claim 10 wherein at least one the first and the second output impedance is a capacitive-impedance, the circuit has a large time constant characteristic.

13. The circuit of claim 7 wherein the first input impedance is a switched capacitor circuit, the switched capacitor circuit comprises:
a capacitor coupled between a first node and a ground end;
a first switch with one end coupled to the first node and another end used as an end of the switched capacitor circuit; and
a second switch with one end coupled to the first node and another end used as another end of the switched capacitor circuit,
wherein the first switch and the second switch are turned on alternately by the first control signal.

14. The circuit of claim 7 wherein the resistances of the first and second input impedances are so controlled by the first and the second control signals respectively, that they are substantially different from each other.

15. A circuit comprising:
a differential amplifier comprising a positive input end, a negative input end, a positive output end, arid a negative output end;
a first input impedance coupled between the negative input end and a first input signal;
a second input impedance coupled between the positive input end and a second input signal;

a first output impedance coupled between the negative input end and the positive output end;

a second output impedance coupled between the negative input end and the negative output end;

a third output impedance coupled between the positive input end and the positive output end, the third output impedance being substantially equivalent to the second output impedance; and a fourth output impedance coupled between the positive input end and the negative output end, the fourth output impedance being substantially equivalent to the first output impedance, wherein resistances of the first and second output impedances are controlled by a first and a second control signals respectively;

wherein the resistances of the first and the second output impedances are close to each other.

16. The circuit of claim 15 wherein the resistances of the first and the second output impedances are so controlled by the first and the second control signals as to be substantially different from each other.

17. The circuit of claim 16 wherein the first and the second input impedance is a resistive-impedance, the circuit has a high voltage gain characteristic.

18. The circuit of claim 16 wherein at least one the first and the second input impedance is a capacitive-impedance, the circuit has a large time constant characteristic.

19. The circuit of claim 15 wherein the first output impedance is a switched capacitor circuit, the switched capacitor circuit comprises:

a capacitor coupled between a first node and a ground end;

a first switch with one end coupled to the first node and another end used as an end of the switihed capacitor circuit; and a second switch with one end coupled to the first node and another end used as another end of the switched capacitor circuit, wherein the first switch and the second switch are turned on alternately by the first control signal.

20. A circuit comprising:

a differential amplifier comprising a positive input end, a negative input end, a positive output end, and a negative output end;

a first input impedance coupled between the negative input end and a first input signal;

a second input impedance coupled between the positive input end and the first input signal;

a third input impedance coupled between the negative input end and a second input signal, the third input impedance being substantially equivalent to the second input impedance;

a fourth input impedance coupled betwcen the positive input end and the second input signal, the fourth input impedance being substantially equivalent to the first input impedance;

a first output impedance coupled between the negative input end and the positive output end;

a second output impedance coupled between the negative input end and the negative output end;

a third output impedance coupled between the positive input end and the positive output end, the third output impedance being substantially equivalent to the second output impedance; and a fourth output impedance coupled between the positive input end and the negative output end, the fourth output impedance being substantially equivalent to the first output impedance, wherein the positive output end is for outputting a first output signal, and the negative output end is for outputting a second output signal.

21. The circuit of claim 20 wherein the first input impedance, the second input impedance, the third input impedance, the fourth input impedance, the first output impedance, the second output impedance, the third output impedance, or the fourth output impedance is a switched capacitor circuit.

* * * * *